(12) United States Patent
Waki et al.

(10) Patent No.: US 11,283,045 B2
(45) Date of Patent: Mar. 22, 2022

(54) LIGHT-EMITTING DEVICE

(71) Applicants: PIONEER CORPORATION, Tokyo (JP); TOHOKU PIONEER CORPORATION, Tendo (JP)

(72) Inventors: Noriaki Waki, Yamagata (JP); Yoshitaka Katano, Yamagata (JP)

(73) Assignee: PIONEER CORPORATION, Tokyo (JP)

( * ) Notice: Subject to any disclaimer, the term of this patent is extended or adjusted under 35 U.S.C. 154(b) by 203 days.

(21) Appl. No.: 16/497,733

(22) PCT Filed: Oct. 10, 2017

(86) PCT No.: PCT/JP2017/036577
§ 371 (c)(1),
(2) Date: Sep. 25, 2019

(87) PCT Pub. No.: WO2018/179527
PCT Pub. Date: Oct. 4, 2018

(65) Prior Publication Data
US 2021/0167326 A1 Jun. 3, 2021

(30) Foreign Application Priority Data
Mar. 27, 2017 (JP) .............................. JP2017-060830

(51) Int. Cl.
*H01L 51/52* (2006.01)
(52) U.S. Cl.
CPC .... *H01L 51/5253* (2013.01); *H01L 2251/303* (2013.01); *H01L 2251/5392* (2013.01); *H01L 2251/558* (2013.01)
(58) Field of Classification Search
CPC ........... H01L 51/5253; H01L 2251/303; H01L 2251/5392; H01L 2251/558; H01L 51/50; H05B 33/12; H05B 33/22
See application file for complete search history.

(56) References Cited

U.S. PATENT DOCUMENTS 9,570,489 B2 2/2017 Kido et al.
9,679,949 B2 6/2017 Jung
(Continued)

FOREIGN PATENT DOCUMENTS

JP 2004-179028 A 6/2004
JP 2006-221865 A 8/2006
(Continued)

OTHER PUBLICATIONS

International Search Report for related International Application No. PCT/JP2017/036577, dated Dec. 26, 2017; 2 pages.
(Continued)

*Primary Examiner* — Kyoung Lee
(74) *Attorney, Agent, or Firm* — Procopio, Cory, Hargreaves & Savitch LLP

(57) ABSTRACT

A light-emitting device (10) is, for example, a segment type display device, a display, or a lighting device, and includes a light-emitting portion (140), a light-transmitting portion (142), and an insulating film (150). The light-emitting portion (140) has a first electrode (110), an organic layer (120), and a second electrode (130). The light-transmitting portion (142) has the first electrode (110), the second electrode (130), and a first layer. The first layer is located between the first electrode (110) and the second electrode (130). In an example illustrated in the figure, the first layer is at least a part of the organic layer (120). The insulating film (150) defines the light-emitting portion (140) and is located in the light-transmitting portion (142).

14 Claims, 8 Drawing Sheets

(56) References Cited

U.S. PATENT DOCUMENTS

| | | | |
|---|---|---|---|
| 9,865,668 B2 | 1/2018 | Sato | |
| 2013/0015513 A1 | 1/2013 | Kido et al. | |
| 2015/0076472 A1 | 3/2015 | Jung | |
| 2015/0108455 A1 | 4/2015 | Jung | |
| 2016/0315133 A1* | 10/2016 | Sato | ............... G09G 3/3233 |
| 2017/0148833 A1 | 5/2017 | Kido et al. | |
| 2017/0278915 A1 | 9/2017 | Jung | |
| 2018/0090551 A1 | 3/2018 | Sato | |
| 2019/0157369 A1 | 5/2019 | Sato | |

FOREIGN PATENT DOCUMENTS

| | | |
|---|---|---|
| JP | 2013021169 A | 1/2013 |
| JP | 2013211169 A | 10/2013 |
| JP | 2015-079758 A | 4/2015 |
| JP | 2015-079955 A | 4/2015 |
| JP | 2016021347 A | 2/2016 |
| JP | 2016062859 A | 4/2016 |
| JP | 2016-157572 A | 9/2016 |
| JP | 2016-162562 A | 9/2016 |
| JP | 2016-207486 A | 12/2016 |
| WO | 20150125308 A | 8/2015 |

OTHER PUBLICATIONS

Office Action for related JP App. No. 2019508527 dated May 19, 2020; 2 pages.

Office Action Response for related JP App. No. 2015-508527 dated Sep. 17, 2020. English translation provided; 5 pages.

\* cited by examiner

US 11,283,045 B2

LIGHT-EMITTING DEVICE

CROSS-REFERENCE TO RELATED APPLICATIONS

This application is a U.S. National Stage entry of PCT Application No: PCT/JP2017/036577 filed Oct. 10, 2017, which claims priority to Japanese Patent Application No. 2017-060830, filed Mar. 27, 2017, the contents of which are incorporated herein by reference.

TECHNICAL FIELD

The present invention relates to a light-emitting device.

BACKGROUND ART

In recent years, a light-emitting device using an organic light-emitting layer has been developed. A light-emitting portion of the light-emitting device has a structure in which the organic light-emitting layer is disposed between two electrodes, and is often defined using an insulating layer. The insulating layer is used to reduce a short circuit between the two electrodes.

For example, Patent Document 1 describes that the thickness of an insulating layer is 0.1 µm. In Patent Document 1, as the insulating layer, a polymer material such as a polyimide resin is exemplified.

Patent Document 2 describes that the Rz of the unevenness of the surface of an insulating layer is 40 nm or greater. Also in Patent Document 2, as the insulating layer, a polymer material such as a polyimide resin is exemplified.

RELATED DOCUMENT

Patent Document

[Patent Document 1] Japanese Unexamined Patent Publication No. 2004-179028
[Patent Document 2] Japanese Unexamined Patent Publication No. 2006-221865

SUMMARY OF THE INVENTION

Technical Problem

In the light-emitting device using the organic light-emitting layer, when a region in the periphery of the light-emitting portion has a light-transmitting property, a user of the light-emitting device, seeing the surroundings through the light-emitting device, can see light from the light-emitting device (for example, characters or images) with the light merged with the surroundings. When the light-emitting device does not emit light, however, interference fringes may be seen at the boundary between the light-emitting portion and the periphery due to the presence or absence of the insulating layer to define the light-emitting portion.

One example of problems to be solved by the present invention is to reduce the possibility to see interference fringes at the boundary between the light-emitting portion and the periphery in a light-emitting device having a light-transmitting property at a region in the periphery of a light-emitting portion.

Solution to Problem

An invention according to claim 1 is a light-emitting device including:

a light-emitting portion including a first electrode, an organic layer, and a second electrode in this order;

a light-transmitting portion including the first electrode, the second electrode, and a first layer located between the first electrode and the second electrode; and an insulating film defining the light-emitting portion and located in the light-transmitting portion.

BRIEF DESCRIPTION OF THE DRAWINGS

The foregoing and other objects, features, and advantages will become more apparent from the preferred embodiments described below and the following drawings associated therewith.

DESCRIPTION OF EMBODIMENTS

Figure 1:
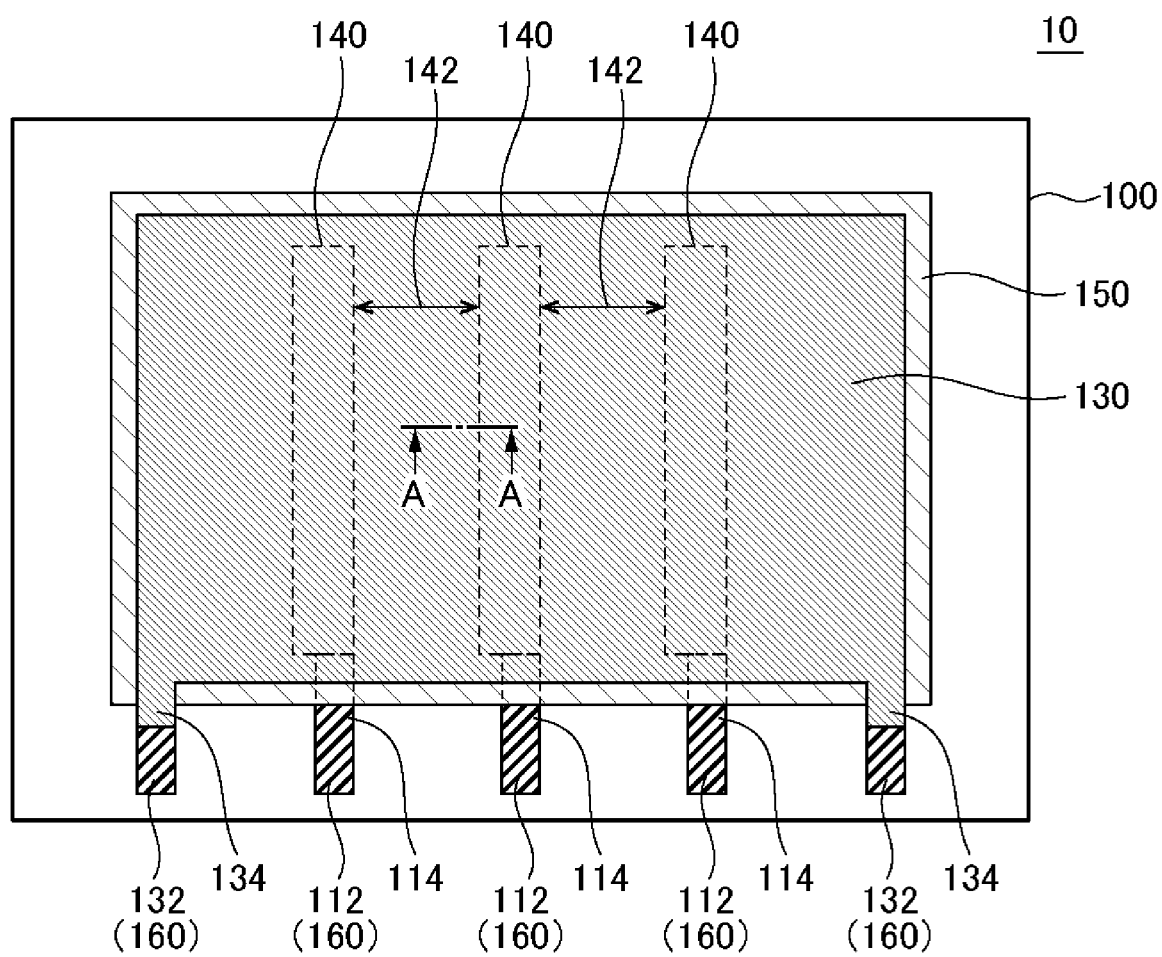
FIG. 1 is a plan view of a light-emitting device according to an embodiment.

Hereinafter, embodiments of the present invention will be described with reference to the drawings. In all the drawings, like elements are denoted by like reference numerals, and the description thereof will not be repeated.

Embodiment

Figure 2:
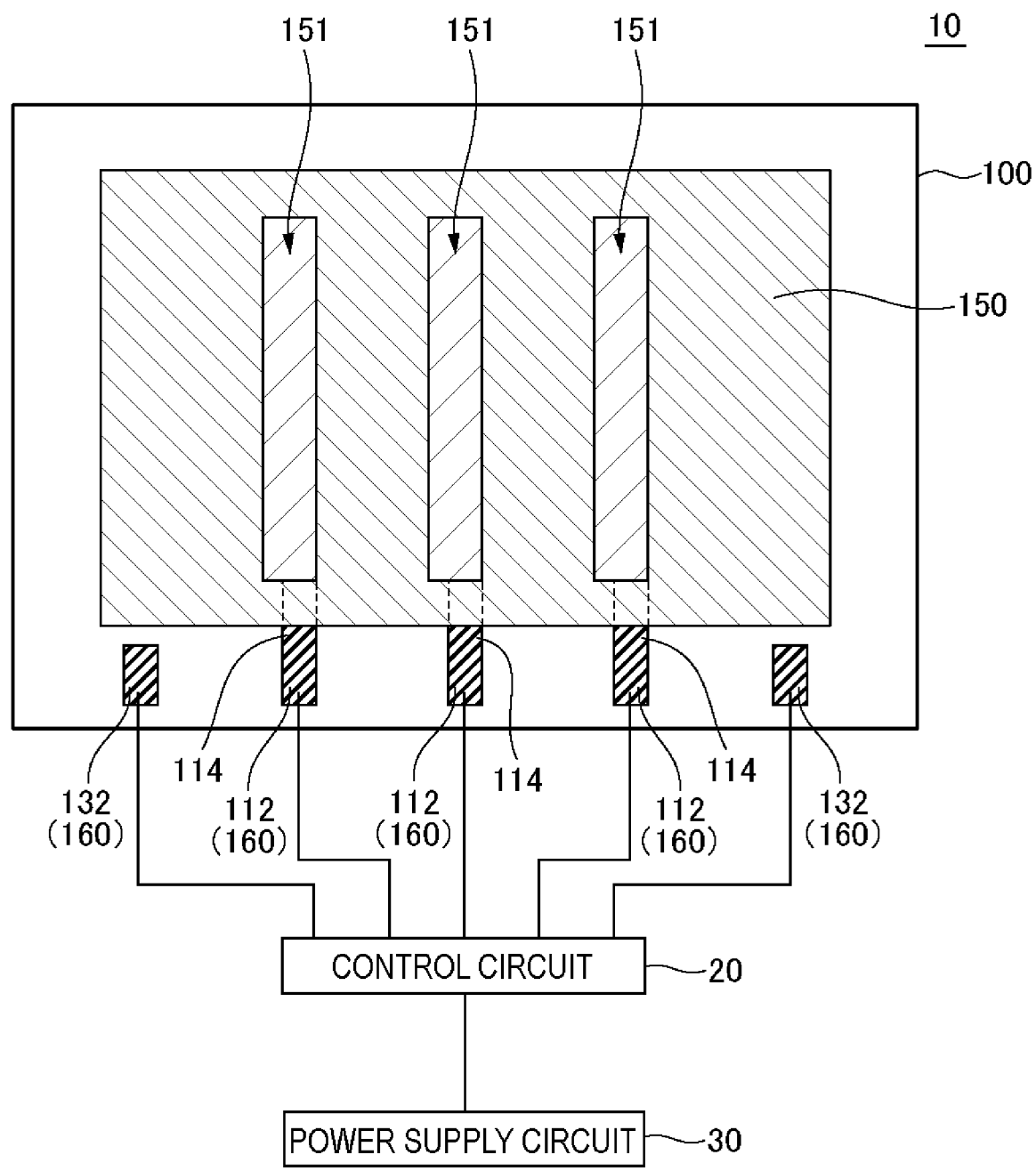
FIG. 2 is a view with a second electrode removed from FIG. 1.
Figure 3:
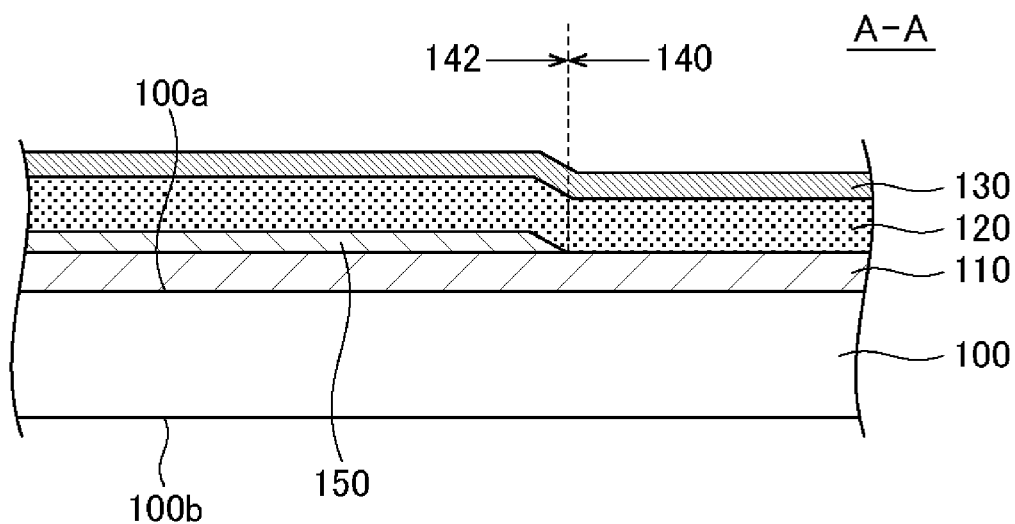
FIG. 3 is a cross-sectional view taken along line A-A of FIG. 1.

FIG. 1 is a plan view of a light-emitting device 10 according to an embodiment. FIG. 2 is a view with a second electrode 130 removed from FIG. 1. FIG. 3 is a cross-sectional view taken along line A-A of FIG. 1. The light-emitting device 10 is, for example, a segment type display device, a display, or a lighting device, and includes light-emitting portions 140, light-transmitting portions 142, and an insulating film 150. The light-emitting portion 140 has a first electrode 110, an organic layer 120, and a second electrode 130. The light-transmitting portion 142 has the first electrode 110, the second electrode 130, and a first layer. The first layer is located between the first electrode 110 and the second electrode 130. In the example illustrated in the figure, the first layer is at least a part of the organic layer 120. The insulating film 150 defines the light-emitting portion 140 and is located in the light-transmitting portion 142. Hereinafter, the light-emitting device 10 will be described in detail.

In the example illustrated in FIGS. 1 to 3, the light-emitting device 10 has a plurality of the light-emitting portions 140. The plurality of light-emitting portions 140 is formed using a substrate 100. The light-emitting portion 140 is of, for example, a bottom emission type, but may be of a top emission type or a dual emission type. In a non-emitting state, the light-emitting portion 140 has a light-transmitting property.

The substrate 100 is formed of a light-transmissive material such as glass or a light-transmissive resin, for example. The substrate is a polygon such as a rectangle. The substrate 100 may have flexibility. When the substrate 100 has flexibility, the thickness of the substrate 100 is, for example, 10 μm or greater and 1000 μm or less. In particular, when the substrate 100 having glass is made flexible, the thickness of the substrate 100 is, for example, 200 μm or less. When the substrate 100 formed of a resin material is made flexible, the material of the substrate 100 is, for example, at least one of polycarbonate (PC), acrylic, polyethylene naphthalate (PEN), polyether sulfone (PES), polyethylene terephthalate (PET), and polyimide. When the substrate 100 is formed of a resin material, it is preferable that an inorganic barrier film such as $SiN_x$ or SiON is formed on at least the light-emitting surface (preferably both surfaces) of the substrate 100 in order to reduce permeation of moisture through the substrate 100. The substrate 100 may be a substrate (inorganic-organic hybrid substrate) having at least one resin layer and at least one inorganic layer.

The plurality of light-emitting portions 140 is formed on a first face 100a of the substrate 100, and has the first electrode 110, the organic layer 120, and the second electrode 130 in this order from the first face 100a side. Both the first electrode 110 and the second electrode 130 have a light-transmitting property. The first electrode 110 is an anode, and is formed individually for each of the plurality of light-emitting portions 140. On the other hand, the second electrode 130 is a cathode, and is an electrode common to the plurality of light-emitting portions 140.

The first electrode 110 is formed of a transparent conductive film. The transparent conductive film is a material containing a metal, for example, a metal oxide such as Indium Tin Oxide (ITO), Indium Zinc Oxide (IZO), Indium Tungsten Zinc Oxide (IWZO), and Zinc Oxide (ZnO). The refractive index of the material of the transparent electrode is, for example, 1.5 or greater and 2.2 or less. The thickness of the transparent electrode is, for example, 10 nm or greater and 500 nm or less. The transparent electrode is formed, for example, using a sputtering method or a vapor deposition method. The transparent electrode may be a conductive organic material such as carbon nanotube or PEDOT/PSS, or may be a thin metal electrode (for example, a MgAg alloy, Mg, or Ag).

The organic layer 120 is located between the first electrode 110 and the second electrode 130, and has a plurality of layers. One of the plurality of layers is a light-emitting layer. Each of the layers constituting the organic layer 120 is formed using, for example, a vapor deposition method, but at least one of the layers may be formed by an application method.

Similar to the first electrode 110, the second electrode 130 is formed of a transparent conductive film. The transparent conductive film has any one of the structures exemplified as the transparent conductive film constituting the first electrode 110. For example, the second electrode 130 is formed using a thin metal film such as a MgAg alloy or a metal oxide film such as ITO or IZO.

The insulating film 150 is formed on the first electrode 110. The insulating film 150 has an opening 151 in a region of the first electrode 110 that is to become the light-emitting portion 140. In other words, the insulating film 150 defines the light-emitting portion 140. The insulating film 150 contains an inorganic material such as at least one of silicon oxide, silicon oxynitride, and silicon nitride, for example. The thickness of the insulating film 150 is 50 nm or less, and preferably 30 nm or less. In addition, the film thickness of the insulating film 150 is less than the thickness from the upper surface of the first electrode 110 to the lower surface of the second electrode 130 of the light-emitting portion 140. In other words, the thickness of the insulating film 150 is less than the thickness of the organic layer 120 in the light-emitting portion 140. The insulating film 150 is formed using a sputtering method or a CVD method.

The light-emitting device 10 has the light-transmitting portion 142. The light-transmitting portion 142 is a region that does not emit light but transmits light. The light-transmitting portion 142 is adjacent to the light-emitting portion 140. In other words, the light-transmitting portion 142 is located in the periphery of the light-emitting portion 140.

As illustrated in FIG. 3, the insulating film 150 is formed in the light-transmitting portion 142. On the other hand, the first electrode 110, the organic layer 120, and the second electrode 130 are formed in both the light-emitting portion 140 and the light-transmitting portion 142. In other words, the light-transmitting portion 142 includes the first electrode 110, the insulating film 150, the organic layer 120, and the second electrode 130 in this order from the first face 100a side of the substrate 100. In the example illustrated in FIG. 3, the first electrode 110, the organic layer 120, and the second electrode 130 are formed continuously in the light-emitting portion 140 and the light-transmitting portion 142. In addition, as will be described later, the layer structure of the organic layer 120 located in the light-transmitting portion 142 is different from the layer structure of the organic layer 120 located in the light-emitting portion 140. Thus, the light-emitting portion 140 and the light-transmitting portion 142 have the same layer configuration except for the presence or absence of the insulating film 150 and the layer structure of the organic layer 120.

The light-emitting device 10 includes a first terminal 112, a second terminal 132, a first wire 114, and a second wire 134. The first terminal 112 and the second terminal 132 are terminals for connecting the light-emitting portion 140 to an external control circuit 20. The first wire 114 connects the first terminal 112 to the first electrode 110, and the second wire 134 connects the second terminal 132 to the second electrode 130. In the example illustrated in FIGS. 1 and 2, the first terminal 112 is an end portion of the first wire 114, and the second terminal 132 is an end portion of the second wire 134. The first terminal 112, the first wire 114, the second terminal 132, and the second wire 134 are all formed on the first face 100a of the substrate 100.

The first terminal 112, the second terminal 132, the first wire 114, and the second wire 134 have layers formed of, for example, the same material as the first electrode 110. The layers forming the first terminal 112 and the first wire 114 are integrated with the first electrode 110. At least the first terminal 112 and the second terminal 132 further have a conductive layer 160. The conductive layer 160 is formed using a material having a higher conductivity than the material constituting the first electrode 110, such as a metal layer. For example, the conductive layer 160 has a configuration in which a first metal layer such as Mo or a Mo alloy, for example, a second metal layer such as Al or an Al alloy, for example, and a third metal layer such as Mo or a Mo alloy, for example, are laminated in this order. The second metal layer is the thickest of these three metal layers. The conductive layer 160 may be located on the first terminal 112 and the first wire 114. Since the conductive layer 160, however, is low in light-transmitting property or has a light-shielding property, the conductive layer 160 is not located in the light-transmitting portion 142.

The control circuit 20 is connected to the first terminal 112 and the first wire 114 via, for example, a lead wire. The control circuit 20 receives supply of power from a power supply circuit 30 and controls the timing of supplying the power to the light-emitting portion 140. The voltage applied between the first terminal 112 and the second terminal 132 is, for example, 1 V or greater and 20 V or less. The control circuit 20 supplies power to the light-emitting portion 140 by, for example, a PWM method. In this case, the maximum value of the voltage amplitude is preferably within the above-described voltage range.

The light-emitting device 10 may further have a sealing portion (not illustrated). The sealing portion may have, for example, a configuration in which an inorganic film is laminated, or may have a metal layer such as an aluminum foil and an adhesive layer, or may have a configuration in which a metal foil is attached onto the laminated film via an adhesive layer.

Figure 4:
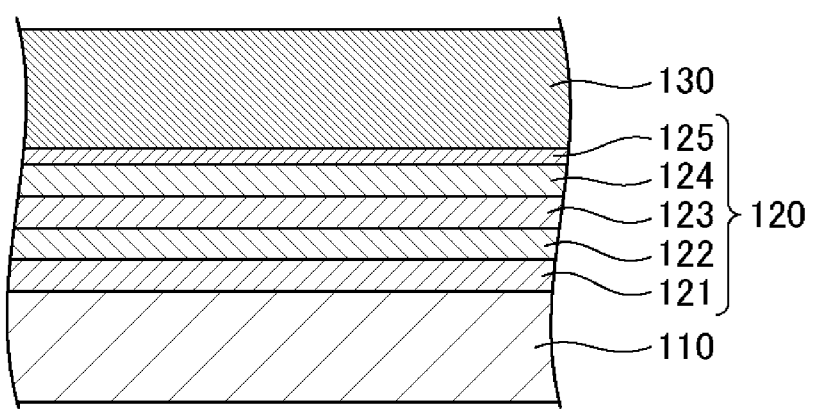
FIG. 4 is a cross-sectional view illustrating an example of the layer structure of an organic layer located in a light-emitting portion.

FIG. 4 is a cross-sectional view illustrating an example of the layer structure of the organic layer 120 located in the light-emitting portion 140. In the light-emitting portion 140, the organic layer 120 includes, from the first electrode 110 side, a hole injection layer 121, a hole transport layer 122, a light-emitting layer 123, an electron transport layer 124, and an electron injection layer 125. The organic layer 120 may further have another layer. For example, the hole injection layer 121 of them may be formed using an application method such as an ink jet method.

Figure 5:
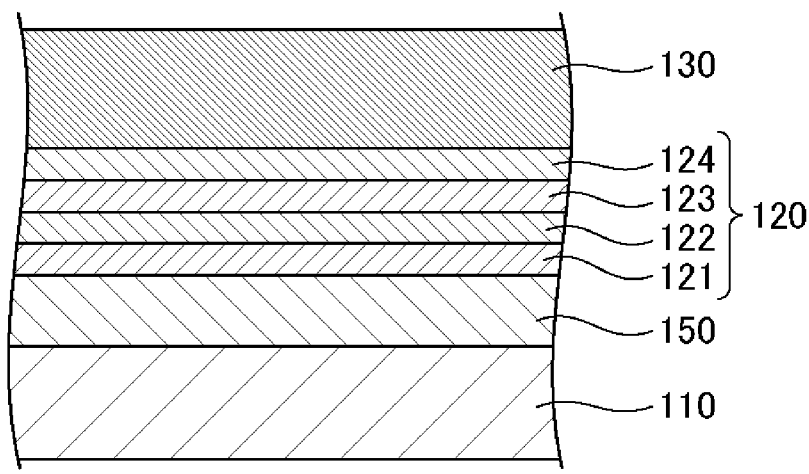
FIG. 5 is a cross-sectional view illustrating an example of the layer structure of the organic layer located in a light-transmitting portion.

FIG. 5 is a cross-sectional view illustrating an example of the layer structure of the organic layer 120 located in the light-transmitting portion 142. In the light-transmitting portion 142, the organic layer 120 has a structure that does not emit light even when a voltage is applied, that is, a layer configuration different from that of the organic layer 120 in the light-emitting portion 140. Thus, the thickness of the organic layer 120 in the light-emitting portion 140, that is, the thickness from the upper surface of the first electrode 110 to the lower surface of the second electrode 130 is different from the thickness of the organic layer 120 in the light-transmitting portion 142, that is, the thickness from the upper surface of the first electrode 110 to the lower surface of the second electrode 130 without the thickness of the insulating film 150. The thickness of the organic layer 120 in the light-transmitting portion 142 is, for example, 20 nm or greater, and preferably 100 nm or greater. This can reduce the occurrence of a leak between the first electrode 110 and the second electrode 130 in the light-transmitting portion 142.

In the example illustrated in FIG. 5, the organic layer 120 of the light-transmitting portion 142 has the same layer structure as the organic layer 120 of the light-emitting portion 140 except that the electron injection layer 125 is not provided. Thus, the thickness of the organic layer 120 located in the light-transmitting portion 142 is less than the thickness of the organic layer 120 located in the light-emitting portion 140. The electron injection layer 125 contains an alkali metal such as Li or Cs as an electron injection material.

Figure 6:
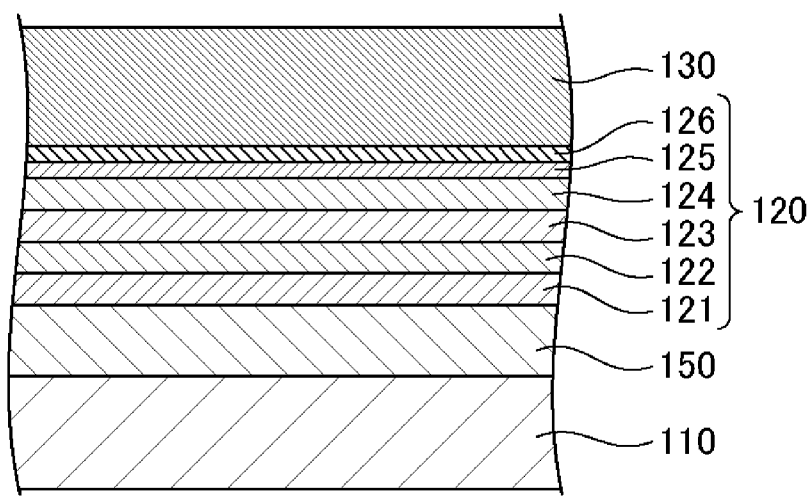
FIG. 6 is a cross-sectional view illustrating a modification example of the layer structure of the organic layer located in the light-transmitting portion.

FIG. 6 is a cross-sectional view illustrating a modification example of the layer structure of the organic layer 120 located in the light-transmitting portion 142. In the example illustrated in the figure, the organic layer 120 located in the light-transmitting portion 142 has a configuration in which a layer 126 is added to the organic layer 120 located in the light-emitting portion 140 such that the organic layer 120 does not emit light even when voltage is applied. The layer 126 is located on the electron injection layer 125 and is formed using a material that inhibits the injection of electrons, such as molybdenum oxide.

The layer 126, however, may be located between the first electrode 110 and the hole injection layer 121. In this case, the layer 126 is formed using a material that inhibits the injection of holes (for example, an alkali metal such as Li or Cs).

Next, a method of manufacturing the light-emitting device 10 will be described. First, the first electrode 110 is formed on the substrate 100. In this case, at least one of layers of the first terminal 112, the first wire 114, the second terminal 132, and the second wire 134 are formed. Then, the conductive layer 160 is formed. Furthermore, the insulating film 150 is formed on the first electrode 110. In this case, the opening 151 is also formed. Then, the organic layer 120 and the second electrode 130 are formed in this order.

In the present embodiment, the film thickness of the insulating film 150 is 50 nm or less. This can reduce the occurrence of interference fringes at the edge of the light-emitting portion 140. In particular, in the present embodiment, the light-emitting portion 140 and the light-transmitting portion 142 have the same layer configuration except for the presence or absence of the insulating film 150 and the layer structure of the organic layer 120. This can further reduce the occurrence of interference fringes at the edge of the light-emitting portion 140.

On the other hand, the thinness of the insulating film 150 may occur a leak between the first electrode 110 and the second electrode 130 in the light-transmitting portion 142. In other words, the thickness of the insulating film 150 is a thickness that can be electrically broken down by an applied voltage applied to the light-emitting portion 140 (for example, a voltage between the first terminal 112 and the second terminal 132). Contrary to this, in the present embodiment, at least a part (first layer) of the organic layer 120 is formed between the first electrode 110 and the second electrode 130 also in the light-transmitting portion 142. This can reduce the occurrence of a leak between the first electrode 110 and the second electrode 130 in the light-transmitting portion 142.

Modification Example 1

Figure 7:
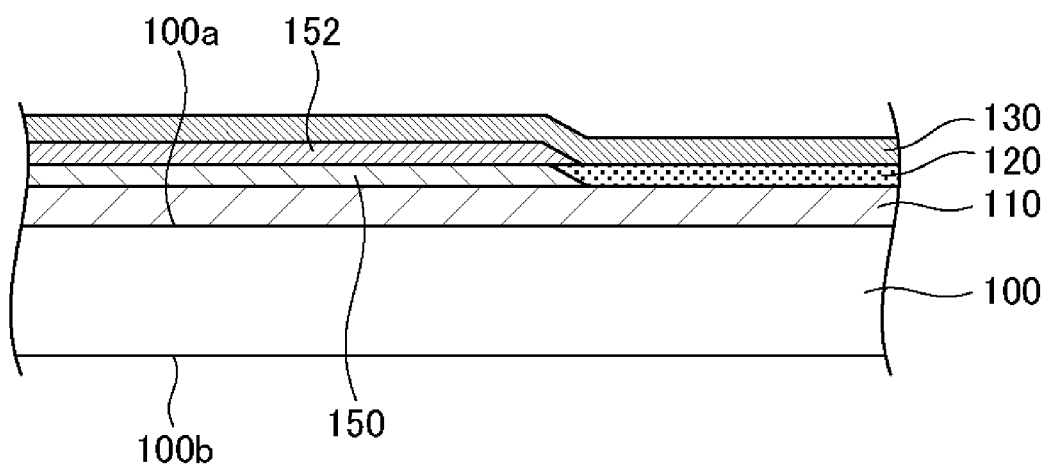
FIG. 7 is a cross-sectional view illustrating the configuration of a light-emitting device according to a modification example 1.

FIG. 7 is a cross-sectional view illustrating the configuration of a light-emitting device 10 according to a modification example 1, and corresponds to FIG. 3 of the embodiment. The light-emitting device 10 according to the present modification example has the same configuration as the light-emitting device 10 according to the embodiment except that a first layer 152 is formed instead of the organic layer 120 in the light-transmitting portion 142. The first layer 152 is formed using an organic material different from the organic layer 120 or an inorganic material. The organic material used for the first layer 152 contains, for example, at least one of a polyimide resin and an epoxy resin. The inorganic material used for the first layer 152 contains at least one of an inorganic oxide such as silicon oxide ($SiO_2$) or a metal oxide (for example, aluminum oxide ($Al_2O_3$)) and silicon nitride ($Si_3N_4$). In this case, the first layer 152 contains a material having a higher resistivity than the organic layer 120. This can reduce the occurrence of a leak between the first electrode 110 and the second electrode 130 in the light-transmitting portion 142, compared to the configuration described in the embodiment.

Similar to the embodiment, the present modification example also can reduce occurrence of interference fringes at the edge of the light-emitting portion 140, and can reduce occurrence of a leak between the first electrode 110 and the second electrode 130 in the light-transmitting portion 142.

Modification Example 2

Figure 8:
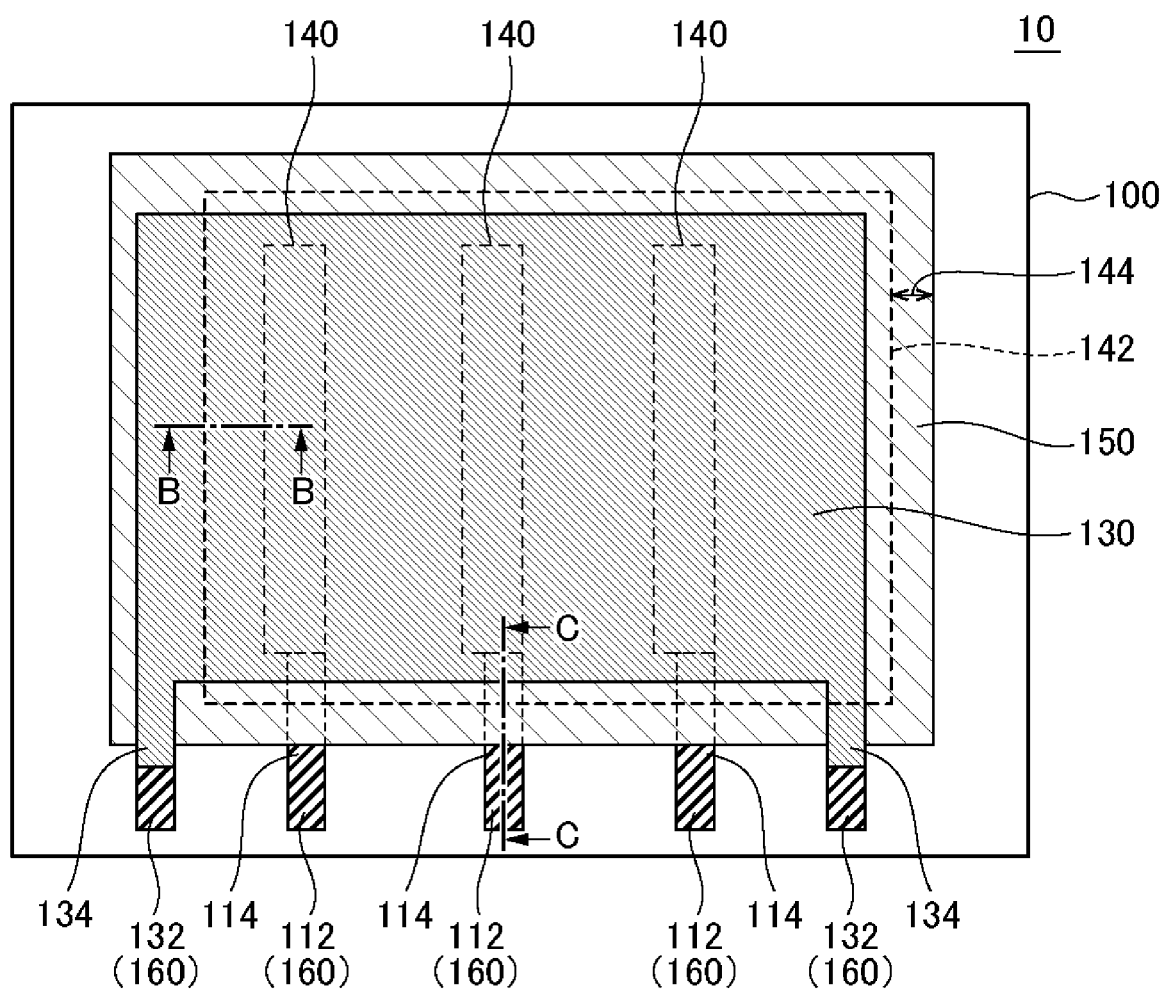
FIG. 8 is a plan view of a light-emitting device according to a modification example 2.
Figure 9:
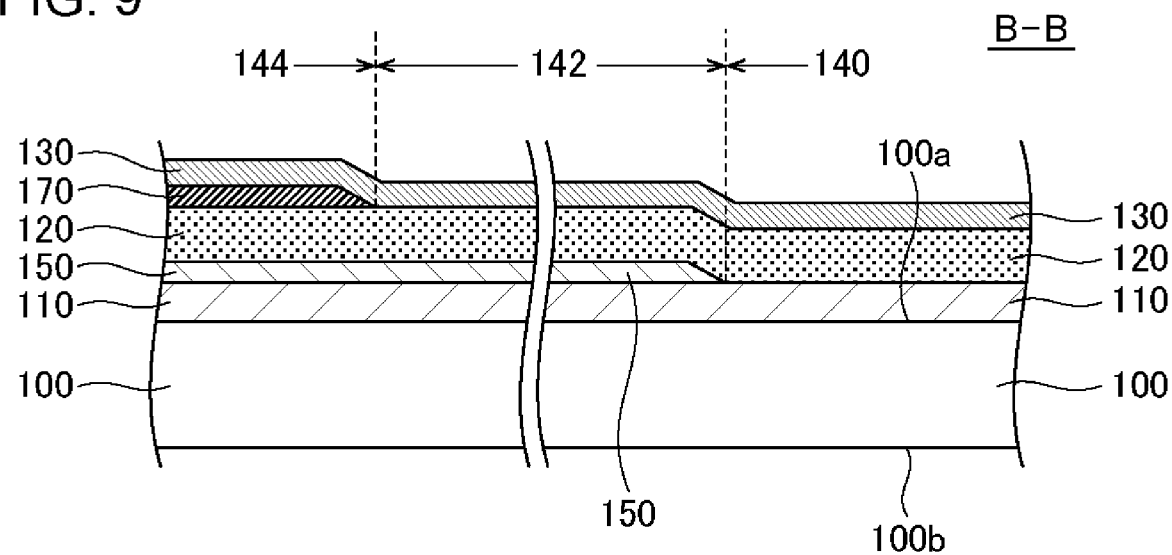
FIG. 9 is a cross-sectional view taken along line B-B in FIG. 8.
Figure 10:
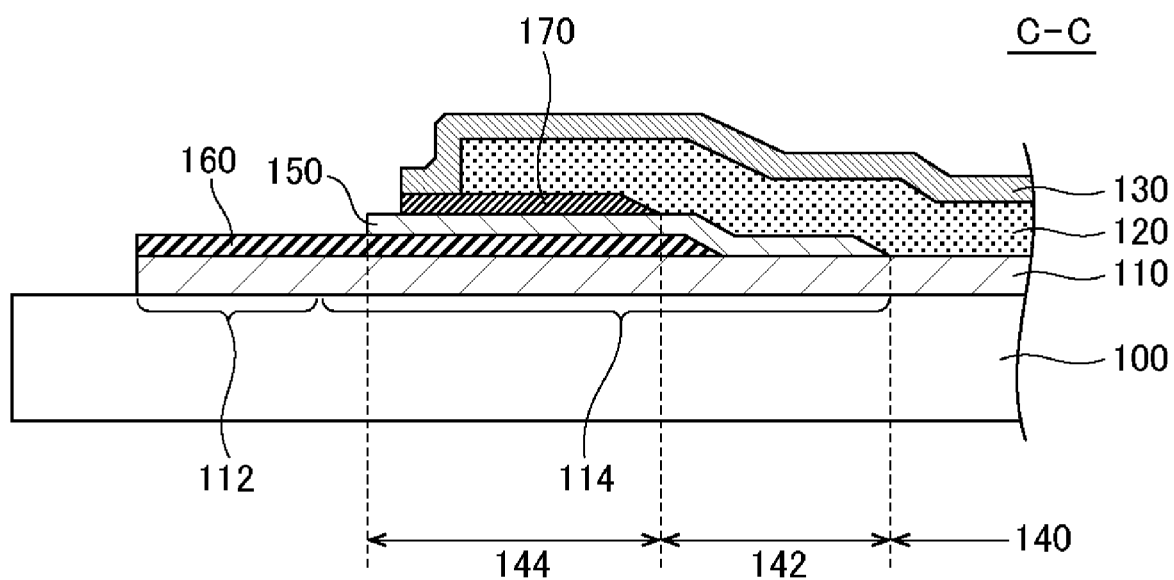
FIG. 10 is a cross-sectional view taken along line C-C in FIG. 8.

FIG. 8 is a plan view of a light-emitting device 10 according to a modification example 2. FIG. 9 is a cross-sectional view taken along line B-B in FIG. 8, and FIG. 10 is a cross-sectional view taken along line C-C in FIG. 8. The light-emitting device 10 according to the present modification example has the same configuration as the light-emitting device 10 according to the embodiment or modification example 1 except that a non-light-emitting portion 144 is provided at a position different from the light-emitting portion 140 and the light-transmitting portion 142 (for example, in the periphery the light-transmitting portion 142).

The non-light-emitting portion 144 is a region where no light-transmitting property is required. As illustrated in FIG. 9, the non-light-emitting portion 144 includes the first electrode 110, the second electrode 130, and a second layer 170. The second layer 170 includes a layer configuration different from that of the organic layer 120, such as an insulating material different from that of the organic layer 120, and is located between the first electrode 110 and the second electrode 130. The resistance value between the first electrode 110 and the second electrode 130 in the non-light-emitting portion 144 is greater than the resistance value between the first electrode 110 and the second electrode 130 in the light-transmitting portion 142. Furthermore, the dielectric breakdown voltage between the first electrode 110 and the second electrode 130 in the non-light-emitting portion 144 is greater than the dielectric breakdown voltage between the first electrode 110 and the second electrode 130 in the light-transmitting portion 142.

In the example illustrated in FIG. 9, the non-light-emitting portion 144 has the insulating film 150 and the organic layer 120 in this order between the first electrode 110 and the second electrode 130. The second layer 170 is located between the organic layer 120 and the second electrode 130. The second layer 170, however, may be located between the first electrode 110 and the insulating film 150, or may be located between the insulating film 150 and the organic layer 120.

When the non-light-emitting portion 144 is a region where light-transmitting property is not required, the second layer 170 need not have a light-transmitting property. The insulating material contained in the second layer 170 is, for example, a resin or a metal oxide.

Furthermore, as illustrated in FIG. 10, a part of the first wire 114 is located in the non-light-emitting portion 144. The conductive layer 160 is formed on the part of the first wire 114 located in the non-light-emitting portion 144. In this case, the resistance of the first wire 114 can be reduced.

Similar to the embodiment, the present modification example can reduce occurrence of interference fringes at the edge of the light-emitting portion 140, and can reduce occurrence of a leak between the first electrode 110 and the second electrode 130 in the light-transmitting portion 142. In addition, since the non-light-emitting portion 144 has the second layer 170, the resistance value between the first electrode 110 and the second electrode 130 in the non-light-emitting portion 144 can be greater than the resistance value between the first electrode 110 and the second electrode 130 in the light-transmitting portion 142. Thus, the possibility of a leak between the first electrode 110 and the second electrode 130 in the non-light-emitting portion 144 is lower than the possibility of a leak between the first electrode 110 and the second electrode 130 in the light-transmitting portion 142.

Example

Figure 11:
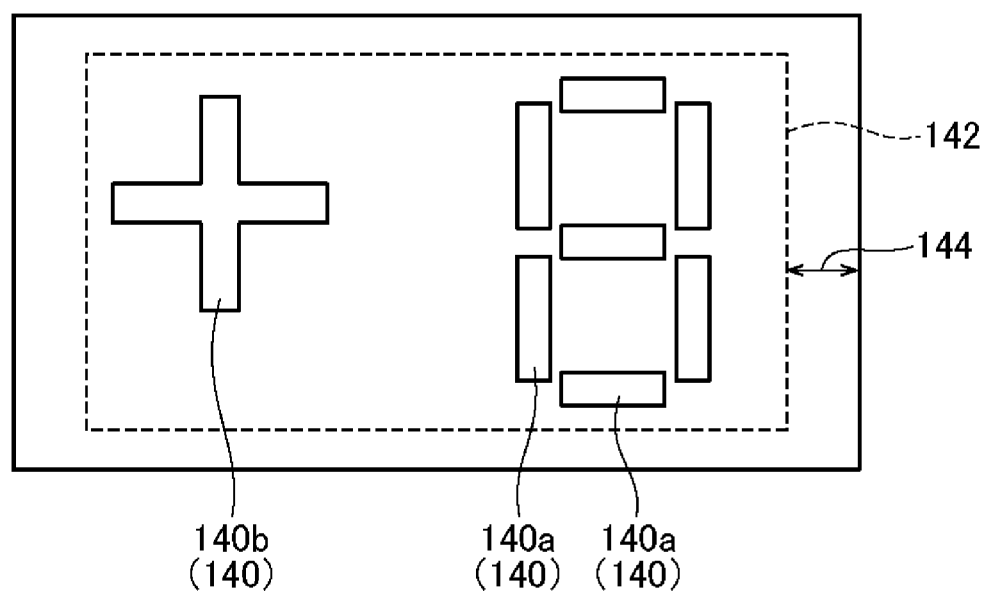
FIG. 11 is a plan view illustrating the configuration of a light-emitting device 10 according to an example.

FIG. 11 is a schematic plan view illustrating the configuration of a light-emitting device 10 according to an example. In the present example, the light-emitting device 10 is a segment type display device, and has a plurality of light-emitting portions 140 (140*a*) for displaying numbers and a light-emitting portion 140 (140*b*) for displaying a cross. The periphery of the plurality of light-emitting portions 140 is a light-transmitting portion 142. In other words, the plurality of light-emitting portions 140 is provided in the light-transmitting portion 142. The periphery of the light-transmitting portion 142 is a non-light-emitting portion 144.

Although the embodiment and examples have been described above with reference to the drawings, these are merely examples of the present invention, and various configurations except the above can be adopted.

This application claims priority to Japanese Patent Application No. 2017-060830 filed on Mar. 27, 2017, the entire disclosure of which is incorporated herein.

The invention claimed is:
1. A light-emitting device comprising:
a light-emitting portion comprising a first electrode, an organic layer, and a second electrode in this order;
a light-transmitting portion comprising the first electrode, the second electrode, and a first layer located between the first electrode and the second electrode, wherein the first layer comprises at least a part of the organic layer; and
an insulating film defining the light-emitting portion and located in the light-transmitting portion,
wherein a thickness from an upper surface of the first electrode of the light-emitting portion to a lower surface of the second electrode of the light-emitting portion is different from a thickness from an upper surface of the first electrode of the light-transmitting portion to a lower surface of the second electrode of the light-transmitting portion without a thickness of the insulating film.
2. The light-emitting device according to claim 1,
wherein the organic layer of the light-emitting portion comprises a layer comprising a charge injection material, and
the organic layer of the light-transmitting portion does not comprise a layer comprising the charge injection material.

3. The light-emitting device according to claim 1, wherein the at least part of the organic layer of the light-emitting portion is continuous with the at least part of the organic layer of the light-transmitting portion.

4. The light-emitting device according to claim 3, wherein the light-transmitting portion comprises the first electrode, the insulating film, the first layer, and the second electrode in this order in a thickness direction.

5. The light-emitting device according to claim 1, wherein the insulating film comprises silicon oxide, and a thickness of the insulating film is 50 nm or less.

6. The light-emitting device according to claim 1, wherein the thickness of the insulating film is less than the thickness from the upper surface of the first electrode of the light-emitting portion to the lower surface of the second electrode of the light-emitting portion.

7. The light-emitting device according to claim 1, further comprising:
a non-light-emitting portion at a position different from the light-emitting portion and the light-transmitting portion,
wherein the non-light-emitting portion comprises the first electrode, the second electrode, and a second layer, and the second layer is located between the first electrode and the second electrode.

8. The light-emitting device according to claim 7, wherein the second layer comprises a layer configuration different from that of the first layer.

9. The light-emitting device according to claim 7, wherein the second layer is a resin layer or a layer made of a metal oxide, and
a resistance value between the first electrode and the second electrode in the non-light-emitting portion is greater than a resistance value between the first electrode and the second electrode in the light-transmitting portion.

10. The light-emitting device according to claim 1, wherein a thickness of the organic layer of the light-emitting portion is different from a thickness of the first layer of the light-transmitting portion.

11. A light-emitting device comprising:
a light-emitting portion comprising a first electrode, an organic layer, and a second electrode in this order;
a light-transmitting portion comprising the first electrode, the second electrode, and a first layer located between the first electrode and the second electrode, wherein the first layer comprises at least a part of the organic layer; and
an insulating film defining the light-emitting portion and located in the light-transmitting portion,
wherein the organic layer of the light-emitting portion comprises a layer comprising a charge injection material, and
the organic layer of the light-transmitting portion does not comprise a layer comprising the charge injection material.

12. A light-emitting device comprising:
a light-emitting portion comprising a first electrode, an organic layer, and a second electrode in this order;
a light-transmitting portion comprising the first electrode, the second electrode, and a first layer located between the first electrode and the second electrode; and
an insulating film defining the light-emitting portion and located in the light-transmitting portion,
wherein the insulating film comprises silicon oxide, and a thickness of the insulating film is 50 nm or less.

13. A light-emitting device comprising:
a light-emitting portion comprising a first electrode, an organic layer, and a second electrode in this order;
a light-transmitting portion comprising the first electrode, the second electrode, and a first layer located between the first electrode and the second electrode;
an insulating film defining the light-emitting portion and located in the light-transmitting portion; and
a non-light-emitting portion at a position different from the light-emitting portion and the light-transmitting portion,
wherein the non-light-emitting portion comprises the first electrode, the second electrode, and a second layer,
wherein the second layer is located between the first electrode and the second electrode, and
wherein the second layer comprises a layer configuration different from that of the first layer.

14. A light-emitting device comprising:
a light-emitting portion comprising a first electrode, an organic layer, and a second electrode in this order;
a light-transmitting portion comprising the first electrode, the second electrode, and a first layer located between the first electrode and the second electrode;
an insulating film defining the light-emitting portion and located in the light-transmitting portion; and
a non-light-emitting portion at a position different from the light-emitting portion and the light-transmitting portion,
wherein the non-light-emitting portion comprises the first electrode, the second electrode, and a second layer,
wherein the second layer is located between the first electrode and the second electrode,
wherein the second layer is a resin layer or a layer made of a metal oxide, and
wherein a resistance value between the first electrode and the second electrode in the non-light-emitting portion is greater than a resistance value between the first electrode and the second electrode in the light-transmitting portion.

* * * * *